(12) United States Patent
Korsah et al.

(10) Patent No.: US 7,608,824 B2
(45) Date of Patent: Oct. 27, 2009

(54) DOPED CARBON NANOSTRUCTURE FIELD EMITTER ARRAYS FOR INFRARED IMAGING

(75) Inventors: Kofi Korsah, Knoxville, TN (US);
Larry R Baylor, Farragut, TN (US);
John B Caughman, Oak Ridge, TN (US); Roger A Kisner, Knoxville, TN (US); Philip D Rack, Knoxville, TN (US); Ilia N Ivanov, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 133 days.

(21) Appl. No.: 11/858,296

(22) Filed: Sep. 20, 2007

(65) Prior Publication Data
US 2009/0078872 A1    Mar. 26, 2009

(51) Int. Cl.
*G01J 5/20*    (2006.01)
(52) U.S. Cl. .................................. 250/338.4
(58) Field of Classification Search ............ 250/338.4
See application file for complete search history.

(56) References Cited

U.S. PATENT DOCUMENTS

| | | | |
|---|---|---|---|
| 5,908,699 A | 6/1999 | Kim | |
| 6,400,088 B1 | 6/2002 | Livingston et al. | |
| 6,504,292 B1 * | 1/2003 | Choi et al. | 313/310 |
| 6,861,790 B1 | 3/2005 | Iwasa et al. | |
| 7,193,210 B2 | 3/2007 | Garber et al. | |
| 7,393,699 B2 * | 7/2008 | Tran | 438/1 |
| 7,492,399 B1 * | 2/2009 | Gulbransen et al. | 348/294 |
| 2006/0193972 A1 * | 8/2006 | Mao et al. | 427/122 |

* cited by examiner

*Primary Examiner*—David P Porta
*Assistant Examiner*—Mindy Vu
(74) *Attorney, Agent, or Firm*—Kirk A. Wilson; Colin L. Cini

(57) ABSTRACT

An infrared imaging device and method for making infrared detector(s) having at least one anode, at least one cathode with a substrate electrically connected to a plurality of doped carbon nanostructures; and bias circuitry for applying an electric field between the anode and the cathode such that when infrared photons are absorbed by the nanostructures the emitted field current is modulated. The detectors can be doped with cesium to lower the work function.

10 Claims, 8 Drawing Sheets

__US 7,608,824 B2__

DOPED CARBON NANOSTRUCTURE FIELD EMITTER ARRAYS FOR INFRARED IMAGING

STATEMENT REGARDING FEDERALLY SPONSORED RESEARCH

This invention was made with United States Government support under Contract No. DE-AC05-00OR22725 between the United States Department of Energy and U.T. Battelle, LLC. The United States Government has certain rights in this invention.

BACKGROUND OF THE INVENTION

There are three basic performance levels in the IR camera market today. First, there are the high performance IR cameras that typically employ IR detectors that are wavelength-selective (e.g., HgCdTe, InSb). These cameras possess several of the following characteristics: high-speed, high-sensitivity, large format, windowing, snapshot mode, and external synchronization. However, they are costly, largely because they require cryogenic cooling (to reduce noise, etc), and HgCdTe is difficult to control during manufacturing. These cameras are typically used in aerospace, military, and research applications. The cost of a high-performance IR camera can range between $70K and $170K. Second, there are the general-purpose IR cameras that are primarily used for predictive maintenance (PM). These cameras must be radiometric but do not require high-speed. The cost of PM cameras range between $40K and $70K. Finally, there are the low-cost uncooled IR cameras, typically based on microbolometer or pyroelectric technology. These cameras detect wavelengths from 3 μm and longer. They operate at low video frame rates and offer a much poorer image due to non-uniformity between pixels. These cameras are used in qualitative applications such as surveillance, fire rescue, and automobile night vision. Uncooled IR cameras cost around $15K. This invention targets the low-cost, uncooled IR detector camera niche. An uncooled IR detector camera that can purchased for around $1000 would be a unique instrument and would revolutionize the IR camera market in much the same way as the development of the uncooled microbolometer camera has over the last five years. Low cost is the key that opens the door to hundreds of markets.

U.S. Pat. No. 6,861,790 to Iwasa teaches a cold cathode element for flat panel displays. The cold cathode element consists of an aluminum substrate on which amorphous carbon film containing cesium is grown using vapor deposition. Several small conical projections of cesium oxide are formed on the film. The "projections" or nanostructures on the substrate are formed of cesium oxide but the type of nanostructure (e.g., nanotube, nanoflake, nanofiber, etc.) is not specified. Iwasa teaches only a basic method of producing low work function field emission and no circuitry for producing a practical device is included.

U.S. Pat. No. 6,400,088 to Livingston et al. teaches an infrared (IR) detector consisting of an anode, a cathode on which is deposited a forest of carbon nanotubes, and bias circuitry for applying an electric field between the anode and the cathode such that when IR photons are absorbed by the nanotubes, photoelectrons are created. Livingston fails to teach that cesium is added to the nanotubes.

U.S. Pat. No. 5,908,699 to Kim teaches a cold cathode element for flat panel displays consisting of an amorphous carbon matrix having cesium dispersed therein, with the cesium present in substantially non-crystalline form. A method of producing the cesium oxide and a method of designing a single electron emission device for improved brightness is also specified.

Field emission properties of carbon nanotubes have been extensively studied for the fabrication of cold cathodes for field emission displays. However, application of this technology to infrared imaging has not been investigated.

BRIEF SUMMARY OF THE INVENTION

An infrared imaging device and method for making infrared detector(s) having at least one anode, at least one cathode with a substrate electrically connected to a plurality of doped carbon nanostructures; and bias circuitry for applying an electric field between the anode and the cathode such that when infrared photons are absorbed by the nanostructures the emitted field current is modulated. The detectors can be doped with cesium to lower the work function.

DETAILED DESCRIPTION OF THE INVENTION

Doped carbon nanostructures are fabricated as low work-function field emitters, in which the incoming infrared energy is used to modulate the emitted field current. Two physical effects are exploited: (1) the reduction in work function when a more electropositive material is used to coat a material, and (2) the reduction in effective work function with increased electric field. The work function of carbon is ~4.6 eV.

It is known that adsorbed layers of electropositive elements, such as cesium, can enhance cathode performance. Enhanced thermionic and field emission from cesiated tungsten filaments were demonstrated by Langmuir and Kingdon in 1923 and Haefer in 1940. When a surface is coated with a thin layer of electropositive (relative to the substrate) material, the work function is reduced.

Kim et. al. have investigated the effect of electric field on the effective work function of capped carbon nanotubes. The effective work function is defined as the difference in energy between the Fermi level and the lowest unoccupied molecular orbital (LUMO). They show that the work function decreases linearly with increasing electric field. The effective work function approaches zero at a high electric field, and electrons can be emitted more easily.

The surface electronic properties of cesiated (doped) carbon films on Si (100) substrates have been investigated by co-deposition of neutral Cs and Cs— ion beams at different energies (25-150 eV). At the Cs— ion beam energy of 150 eV, the work function of the surface decreases to 1.1 eV. Post oxidation of the surface lowers the work function to 1.05 eV. This oxygen treated cesiated carbon film is a reliable cold-cathode electron emitter due to the extremely high thermal stability of the low work function.

Figure 1:
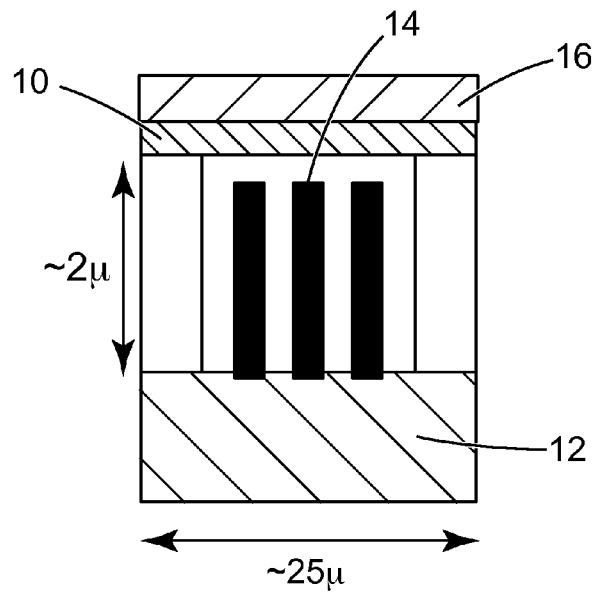
FIG. 1 is a conceptual diagram of a single infrared sensor.

FIG. 1 shows a conceptual diagram of the infrared sensor. This imaging device comprises patterned metal to form an anode 10 with an IR transmissive window 16 made from glass or ceramic disposed on the anode, a cathode 12, also shown at 114 of FIG. 11, having a silicon dioxide layer on a silicon substrate and doped carbon nanostructures 14 with a suitable electric field that will provide a sufficiently low work function of the order of the incoming infrared IR energy shown at 112 of FIG. 11. This enables the field emission current to be modulated by the incident IR energy.

Photoemission in a material is presumed to occur if the impinging photon energy is sufficiently high to raise an electron to an energy level above the peak of the barrier above the surface of the material. In a high electric field, the barrier height can be substantially reduced, resulting in cold (or thermally assisted) field emission. At high electric fields, the surface barrier is lowered by the Schottky effect, in which the electron is attracted to the surface by its image charge. The surface barrier is effectively reduced below the nominal work function by an amount equal to:

$$\phi_d = e\sqrt{eE_f/4\pi\epsilon_o} \tag{1}$$

where:
e is the electron charge ($1.6 \times 10^{-19}$ C);
$E_f$ is the electric field (V/m);
$\epsilon_o$ is the permittivity of free space ($8.85 \times 10^{-12}$ F/m).

Thus, an incoming photon with energy E will be able to eject an electron if:

$$E \geq \Phi - \phi_d \tag{2}$$

Inserting the values of e and $\epsilon_o$ into equation (1), we have:

$$\phi_d = 1.6 \times 10^{-19}\sqrt{\frac{1.6 \times 10^{-19} E_f}{4\pi \times 8.85 \times 10^{-12}}} \tag{3}$$

$$\therefore \phi_d = 5.056 \times 10^{-24}\sqrt{E_f}.$$

Equation 3 has units of energy (charge×volts). By definition, 1 eV is $1.6 \times 10^{-19}$ J, which is the energy given to an electron by accelerating it through 1 volt of electric potential difference. Thus, the value of equation (3) in eV is equal to:

$$\therefore \phi_d = \frac{5.056 \times 10^{-24}\sqrt{E_f}}{1.6 \times 10^{-19}} \text{ eV} \tag{4}$$

$$\therefore \phi_d = 3.79 \times 10^{-5}\sqrt{E_f} \text{ eV}$$

The energy (in eV) of a 5 μm wavelength IR photon is given by:

$$E = hc/\lambda q \tag{5}$$

where:
h=Planck's constant ($6.626 \times 10^{-34}$ Js)
c=speed of light ($2.9979 \times 10^8$ m/s)
λ=wavelength (m)
q=$1.6 \times 10^{-19}$ J Thus, 5 μm IR radiation has an energy of ~0.25 eV.

Equations (2) and (4) show that, by reducing the work function of the carbon nanostructures to 1.1 eV, the minimum electric field necessary to produce field emission from an infrared photon of λ is given by:

$$\sqrt{E_f} \geq \frac{(1.1 - hc/\lambda q)}{3.79 \times 10^{-5}} \tag{6}$$

$$\therefore E_f \geq 696[1.1 - (1.242/\lambda)] \text{ V/μm, where } \lambda \text{ is in microns.}$$

Figure 2:
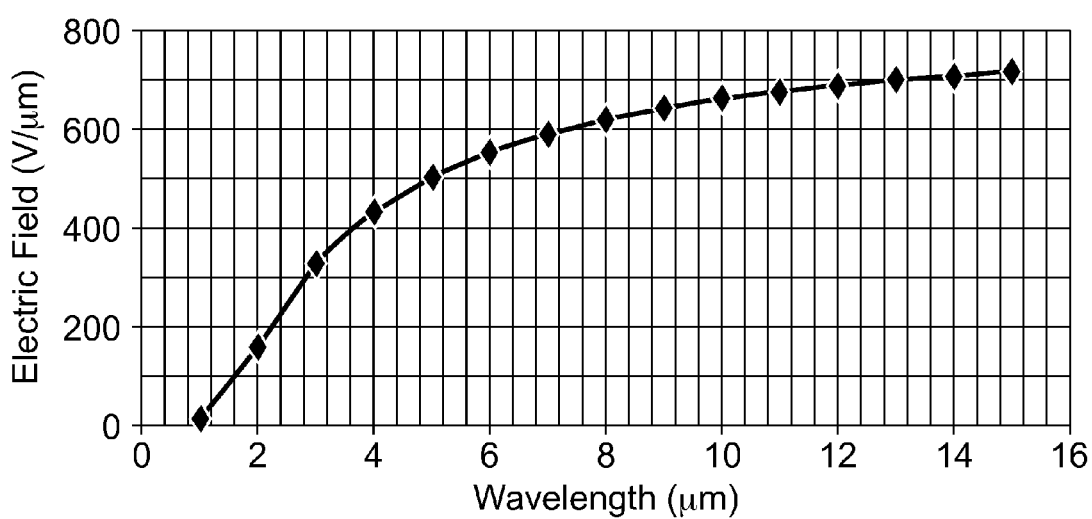
FIG. 2 is a graph of the required (local) electric field as a function of wavelength.
Figure 3:
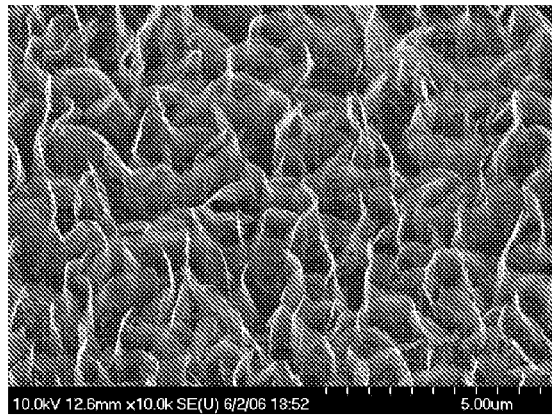
FIG. 3 is a SEM of carbon nanoflakes, carbon nanofibers, and carbon. nanotubes
Figure 3:
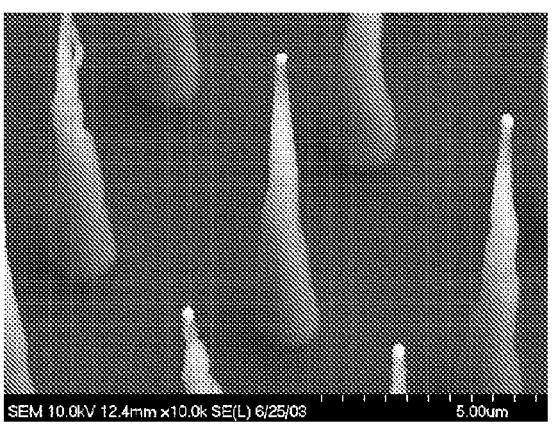
Figure 3:
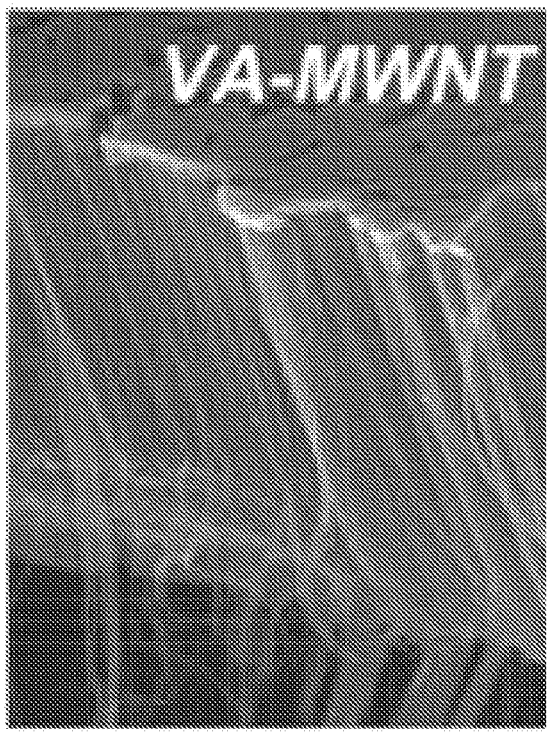

FIG. 2 is a plot of the required field as a function of wavelength (equation 6). Note that equation 6 gives the required local field strength. The global field strength can be much lower than that predicted by equation 6, while still achieving the higher local field strength required because of the very high field enhancement properties of carbon nanostructures, especially carbon nanotubes. A field amplification factor of greater than 500 is easily achievable, resulting in a much lower required electric field. FIG. 3 shows scanning electron microscope (SEM) pictures of various carbon nanostructures.

Figure 4:
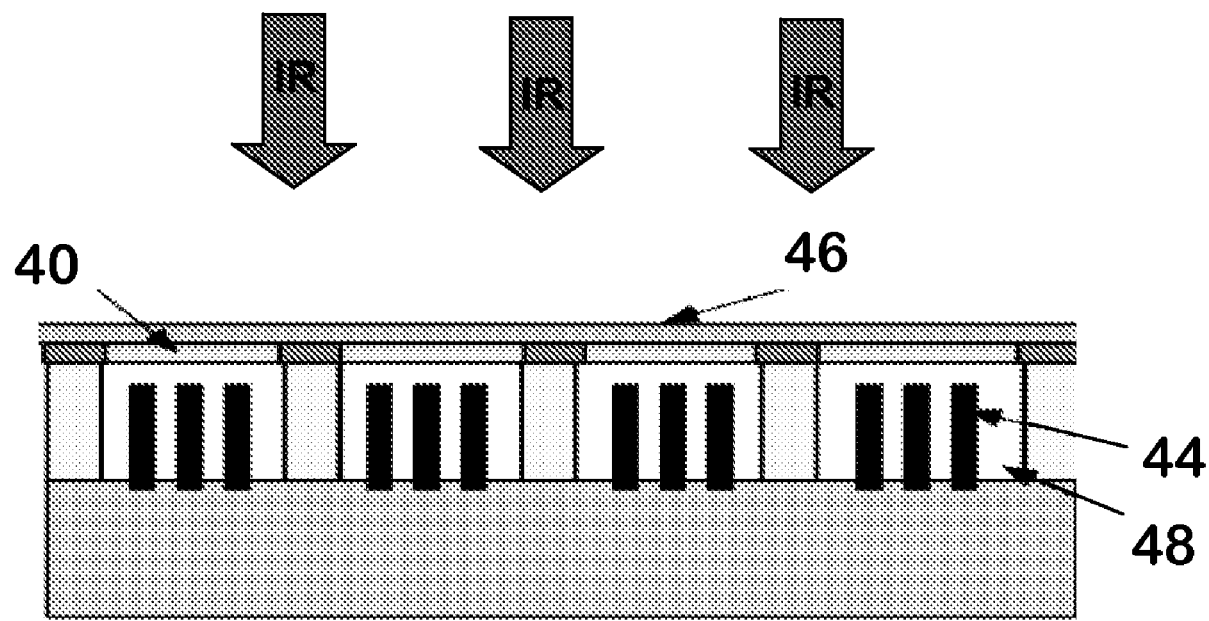
FIG. 4 is a schematic of the pixilated detector array concept.

A method for using an array of carbon nanotubes for infrared imaging is shown in FIG. 4. A "pixel" 48 of this imaging array consists of an array of doped, vertically aligned single wall nanotubes (SWNTs) or multi-wall nanotubes (MWNTs), hereinafter referred to as doped vertically aligned carbon nanotubes (DVACNTs) 44. An anode 40 having an IR transmissive window 46 is disposed atop the structure. The center-to-center distance between the DVACNTs (pitch) is approximately 4 μm. This pitch is selected to reduce electrostatic screening effects (which diminishes the field enhancement factor) while at the same time increasing field penetration as well as optimizing field emission current.

Figure 5:
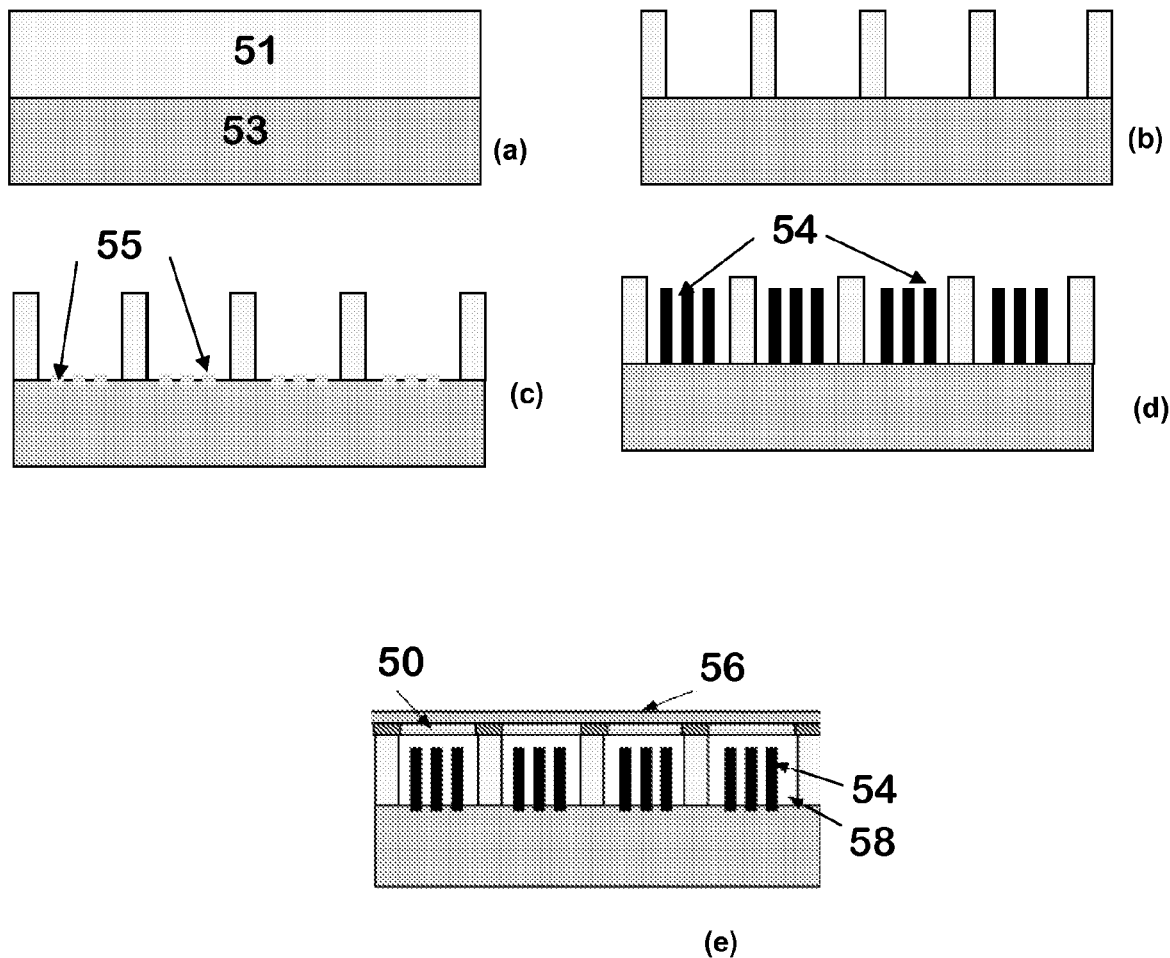
FIG. 5 is an illustration of a detector array fabrication process.

A method for fabricating a detector array consisting of several pixels is shown in FIGS. 5 and 6. The fabrication is in two parts: the bottom cathode section (FIG. 5) and the top anode section (FIG. 6). The cathode section fabrication process begins with depositing a layer of silicon oxide 51 on a silicon substrate 53, then etching out pixel-size circular islands in the silicon. An array of circular metal catalysts 55 (for growing the nanotubes) are then formed in these holes by first depositing a thin film of metal on the silicon oxide/silicon surface, then etching away the unwanted parts to expose back the silicon oxide and silicon surfaces. The CNT 54 arrays are grown from the exposed metal pads on each island of silicon, and then doped with cesium via chemical vapor deposition (CVD) or ion implantation.

Figure 6A:
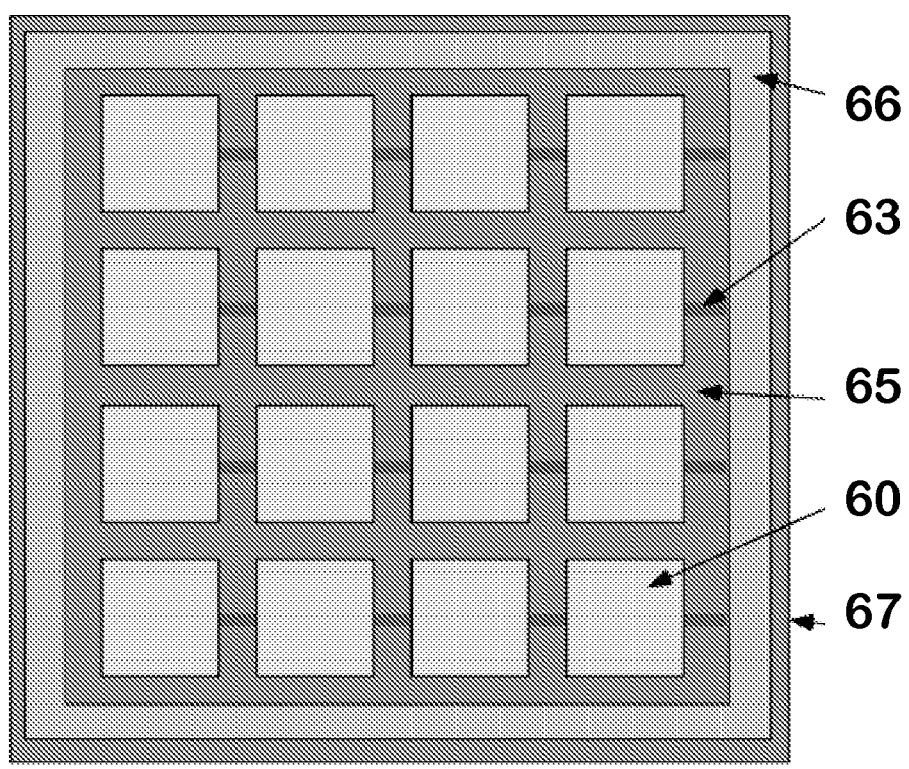
FIG. 6 are schematics of top anode assembly for carbon nanotube IR detector array.
Figure 6B:
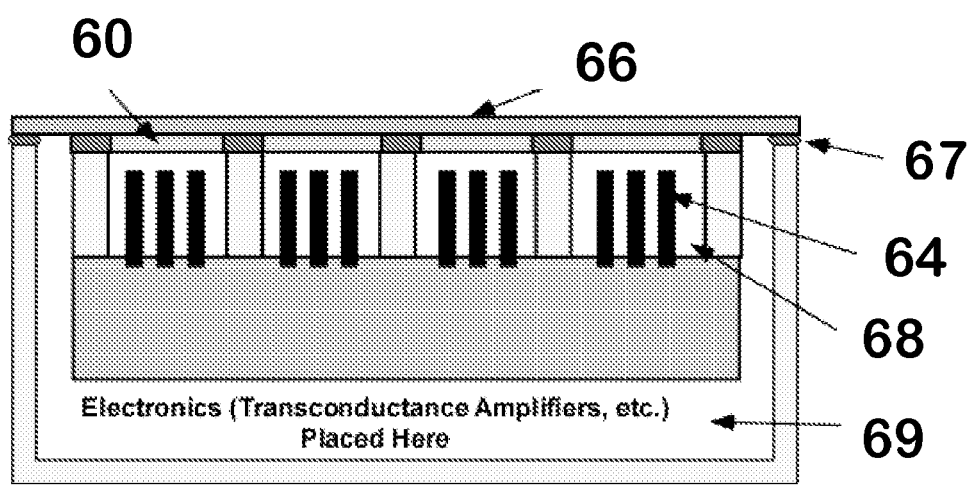

The top anode grid of the field emission pixel array is assembled separately from the bottom section. The grid consists of electrically conductive anodes 60 connected by rows or columns to an edge connection with insulating material 65 placed to isolate individual pixel cells and prevent crosstalk. The anodes 60, connecting wires 63, and insulator 65 are deposited on an infrared transparent window 66. These components are shown in FIG. 6(a). The fabricated top assembly is attached to the cathode section and vacuum sealed by a low-temperature glass melt bead 67. The electronics for each pixel or for rows or columns of pixels are placed beneath the pixel region in the vacuum zone [FIG. 6(b)].

Figure 7:
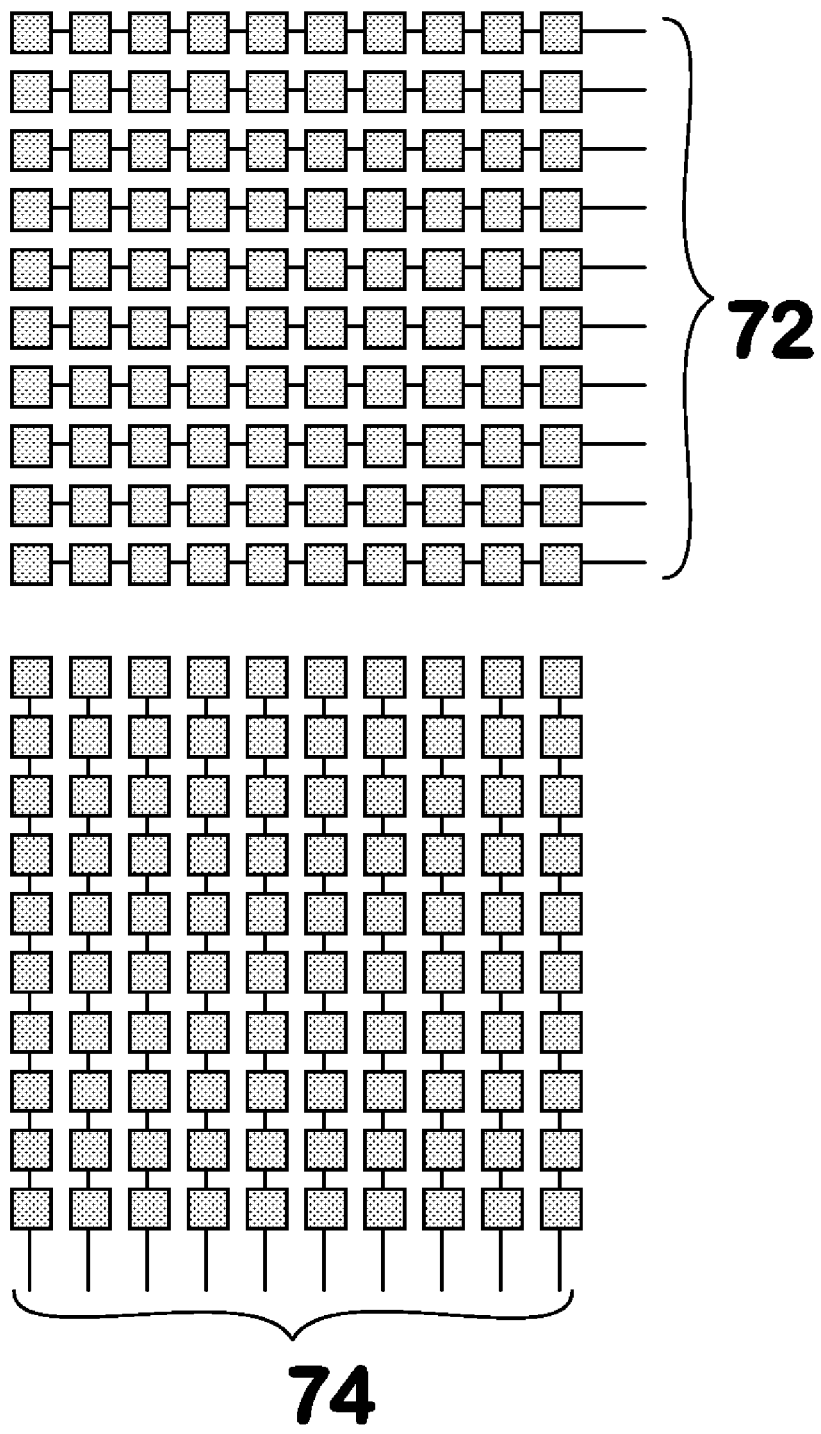
FIG. 7 is a pixel multiplexing scheme

A signal multiplexing method can be applied by sequencing the anode voltage 72 row-by-row while observing the field emission current 74 in each column as shown in FIG. 7.

Each pixel of the array is individually addressable by that method. Alternatively, individual current preamplifiers can be placed under each pixel-cell allowing the columnar signal brought to the edge to be at a higher level and therefore less susceptible to noise and distributed capacitance.

Figure 8:
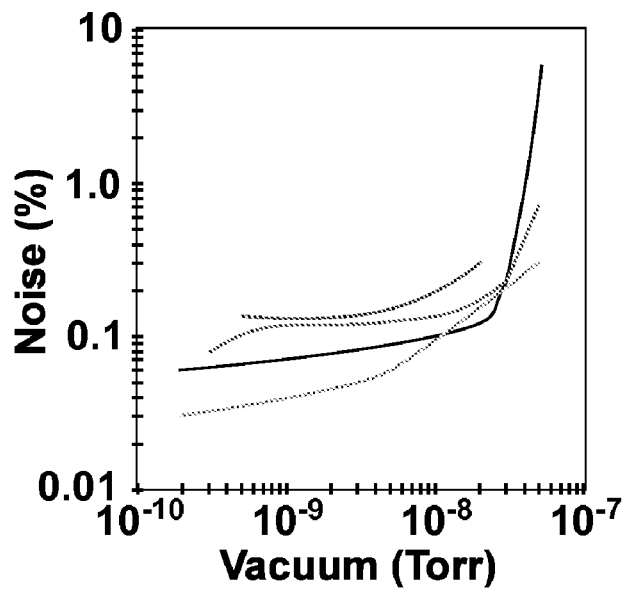
FIG. 8 is a graph of noise as a function of vacuum level for carbon nanotubes.
Figure 9:
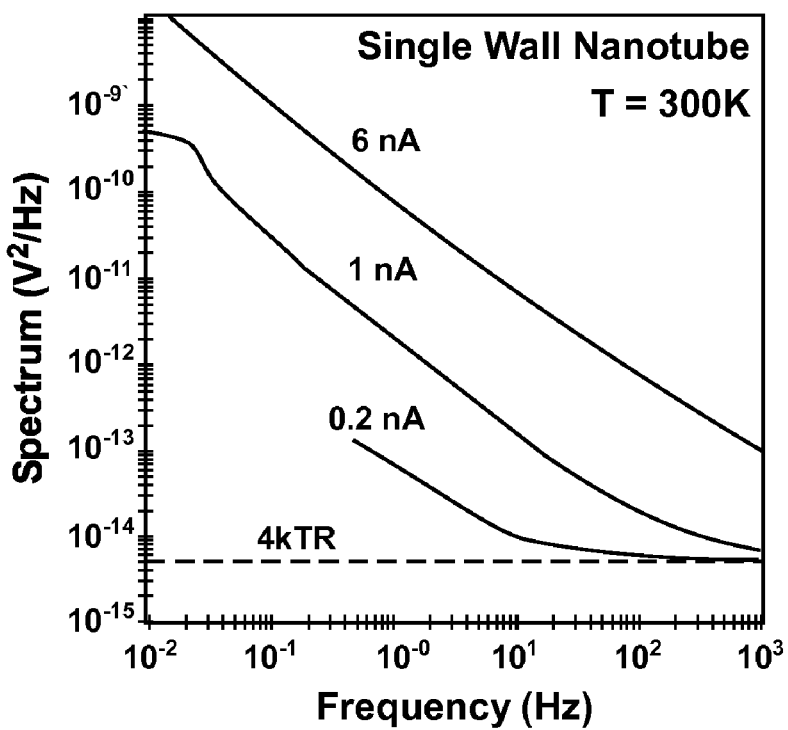
FIG. 9 is a graph of 1/f noise in single-wall nanotubes.

The presence of electronegative atoms and other contamination on the carbon nanotubes leads directly to excess noise and thereby reduces the signal-to-noise ratio in the field emission current of the detector. The vacuum level, therefore, is an important factor in the noise observed in field emission current. At lower vacuum pressure levels, the molecular adsorption rate (and subsequent desorption) becomes higher, which affects emitter stability. N. de Jonge et al., "Low noise and stable emission from carbon nanotube electron sources," Applied Physics Letters 87, 133118 (2005) measured noise as a function of vacuum level. FIG. 8, adapted from N. de Jonge et al., illustrates the lowering of noise with decreased pressure. (The curves, derived from points shown in FIG. 10(b) of the cited paper, represent four different nanotube devices.) A vacuum pressure of $3\times10^{-8}$ Torr means that roughly a monolayer of residual gas atoms forms on the emitter surface about every minute. It is clear that achieving and maintaining a high vacuum condition (greater than $10^{-9}$ Torr) on the carbon nanotubes is necessary for high signal-to-noise performance. Note that other noise sources also exist such as Johnson (from thermal agitation), shot, avalanche, burst, and 1/f. Each noise type must be dealt with uniquely. The 1/f noise, which appears dominant as shown in FIG. 9 [from P. G. Collins et al., "1/f Noise in Carbon Nanotubes," Applied Physics Letters, Vol. 76, No. 7 (2000)], is mitigated by synchronous modulation/demodulation methods (such as used in a lock-in amplifier).

Figure 10:
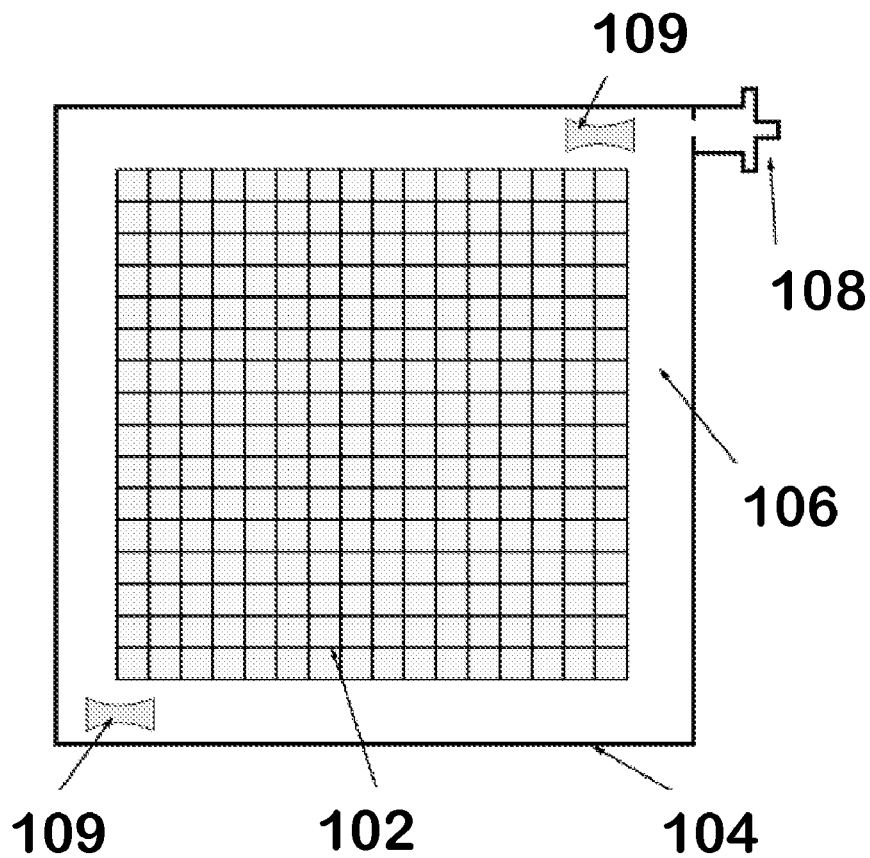
FIG. 10 is a schematic of a method for achieving high vacuum in array device.

A method for achieving high vacuum conditions in an array is depicted in FIG. 10. The steps to achieving high vacuum levels are similar to methods used in fabrication of electronic vacuum tube devices. First, a vacuum is pulled on the entire array 102 of pixels using the vacuum connection 108 shown. A roughing pump in conjunction with either turbo or diffusion pumps brings the vacuum state in the range of $10^{-8}$ Torr. Second, the entire array 102 is baked out at elevated temperature. A target for bake-out temperature is 300° C. although materials of construction may require bake-out at low temperatures. Note that the lower the temperature, the longer the bake-out time becomes. Third, the vacuum connection 108 is sealed after sufficient bake out thus isolating the array device. Fourth, the getters 109 are activated by a localized induction (or microwave) heaters. Getter flashing captures additional oxygen and other contaminant gases. The getter is positioned to deposit on the device walls so that there is no interference with carbon nanotubes, field emission, or the optics that pass the infrared light. Vacuum levels after the gettering step approach $10^{-10}$ Torr. The getter material is chosen so that gettering is continued for the life of the detector array. Note that in the construction of the array, individual pixels must have gas communication back to the vacuum connection. Evacuation to the desired high vacuum level must occur for all pixels.

Figure 11:
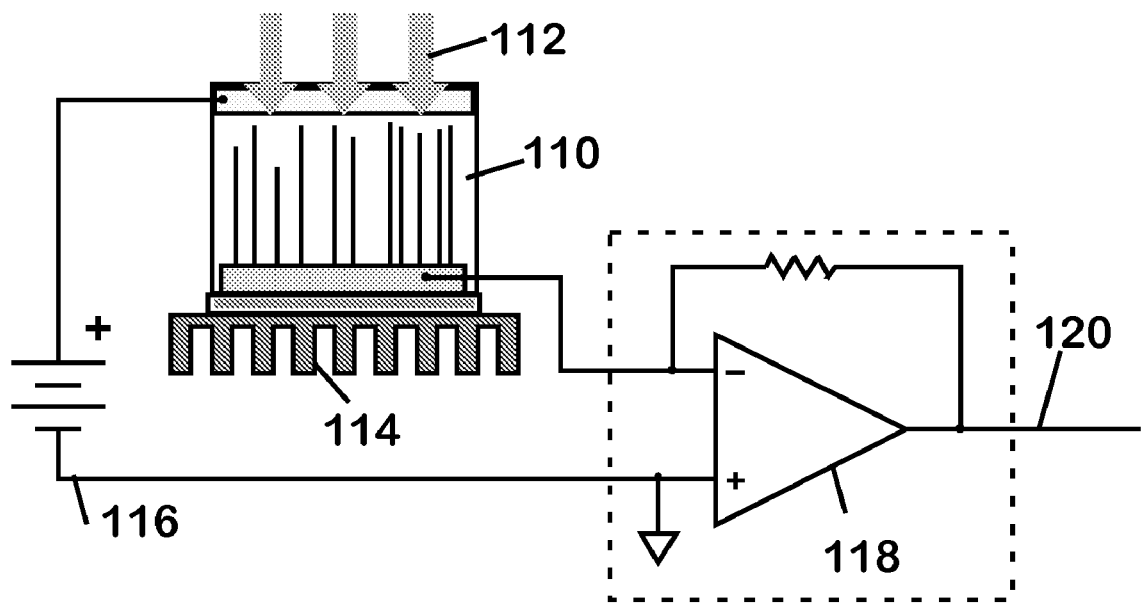
FIG. 11 is an illustration of a readout circuit for a single detector.

FIG. 11 illustrates the readout circuitry using the basic detector cell. Readout methods for the single detector (or detector array) are not limited to the circuit shown in FIG. 11. Claimed techniques and configurations include the following:

Measurement of small field emission current (nano- to micro-amps) 120 using complementary metal oxide semiconductor (CMOS) input transimpedance preamplifier Measurement of field emission current using junction field effect transistor (JFET) input stage of transimpedance preamplifier Measurement of field emission current using bipolar junction transistor (BJT) transimpedance preamplifier Measurement of field emission current using gallium arsenide (GaAs) transistor transimpedance preamplifier Readout circuit configurations include:

Pulsed bias voltage and current input measurement stage with synchronous modulation and demodulation (lock-in amplifier)

Electronics (transimpedance preamplifier 118) mounted directly under each pixel (Pixel as described by a sparse array of carbon nanotubes 110). Indium bump.

Preamplifier stages mounted at edge of circuit board. Matrix addressed by application of external bias voltage 116 on an orthogonal matrix.

Charged coupled array placed under each pixel. The integrated charge accumulated is stepped out of the array and read by a charge sensitive preamplifier.

While there has been shown and described what are at present considered the preferred embodiments of the invention, it will be obvious to those skilled in the art that various changes and modifications can be made therein without departing from the scope.

We claim:

1. A detector for detecting infrared photons comprising:
at least one anode;
at least one cathode further comprising a substrate electrically connected to a plurality of doped carbon nanostructures; and
bias circuitry for applying an electric field between said anode and said cathode such that when infrared photons are absorbed by said nanostructures the emitted field current is modulated for use in a readout portion of said circuitry.

2. The detector of claim 1 wherein said anode further comprises and IR transmissive window.

3. The detector of claim 2 wherein said IR transmissive window further comprises material selected from the group consisting of glass and ceramic.

4. The detector of claim 1 wherein said doped carbon nanostructure further comprises cesium.

5. The detector of claim 1 wherein said carbon nanostructure further comprises at least one structure selected from the group consisting of nanoflakes, nanofibers and nanotubes.

6. The detector claim 5 wherein said nanotubes further comprise doped vertically aligned carbon nanotubes disposed generally perpendicular to said substrate.

7. The detector of claim 5 wherein said nanotubes further comprise single wall nanotubes.

8. The detector of claim 5 wherein said nanotubes further comprise multi wall nanotubes.

9. The detector of claim 1 wherein said readout circuitry portion further comprises at least one transimpedance preamplifier selected from the group consisting of CMOS input, JFET input, BJT, and GaAs transistor.

10. The detector of claim 1 wherein said readout circuitry portion further comprises at least one configuration selected from the group consisting of a lock-in amplifier, a transimpedance preamplifier mounted directly under each pixel, preamplifier stages mounted at the edge of the circuit board, and a charged coupled array placed under each pixel.

* * * * *